(12) United States Patent
Takaki et al.

(10) Patent No.: US 8,306,080 B2
(45) Date of Patent: Nov. 6, 2012

(54) VERTICAL CAVITY SURFACE EMITTING LASER APPARATUS

(75) Inventors: Keishi Takaki, Chiba (JP); Naoki Tsukiji, Chiba (JP); Suguru Imai, Chiba (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/090,395

(22) Filed: Apr. 20, 2011

(65) Prior Publication Data

US 2011/0261846 A1 Oct. 27, 2011

(30) Foreign Application Priority Data

Apr. 21, 2010 (JP) ................................. 2010-098042

(51) Int. Cl.
*H01S 3/00* (2006.01)
(52) U.S. Cl. .................. 372/38.07; 372/38.1; 372/38.02
(58) Field of Classification Search ................. 372/38.1, 372/38.02, 38.07
See application file for complete search history.

(56) References Cited

U.S. PATENT DOCUMENTS

2003/0118063 A1* 6/2003 Sugawara .................. 372/38.02
2009/0238226 A1* 9/2009 Moto et al. ................. 372/38.02

OTHER PUBLICATIONS

N. Suzuki, et al., "25-Gbps operation of 1.1-μm-range InGaAs VCSELs for high-speed optical interconnections," OFA4, OFC2006.

* cited by examiner

*Primary Examiner* — Yuanda Zhang
(74) *Attorney, Agent, or Firm* — Lowe, Hauptman, Ham & Berner, LLP

(57) ABSTRACT

A surface emitting laser apparatus includes an arithmetic processing unit including an I/O unit for externally inputting an instruction and a core unit that performs an operation based on the instruction and outputs a differential voltage signal modulated with a predetermined amplitude according to a result of the operation, capacitors respectively arranged on output paths of the differential voltage signal, and a surface emitting laser device that is directly connected to the arithmetic processing unit via the capacitors. An I/O voltage and a core voltage are externally supplied to the I/O unit and the core unit, respectively. The arithmetic processing unit generates a driving voltage signal by superimposing the differential voltage signal with the core voltage commonly supplied as a bias voltage without stepping up or down the core voltage and without amplifying the differential voltage signal and supplies the driving voltage signal to the surface emitting laser device.

12 Claims, 5 Drawing Sheets

VERTICAL CAVITY SURFACE EMITTING LASER APPARATUS

RELATED APPLICATIONS

The present application is based on, and claims priority from, Japanese Application Number 2010-098042, filed Apr. 21, 2010.

BACKGROUND

1. Technical Field

The present invention relates to a surface emitting laser apparatus.

2. Related Art

FIG. 5 is a block diagram of a conventional surface emitting laser apparatus used in various applications such as an optical interconnection. As shown in FIG. 5, a surface emitting laser apparatus 400 includes an arithmetic processing unit 401, a surface emitting laser device 402, and a laser driving unit 403 connected between the arithmetic processing unit 401 and the surface emitting laser device 402.

The arithmetic processing unit 401 performs calculations according to instructions form the outside, and outputs a differential voltage signal Vs401 based on the calculation results. The arithmetic processing unit 401 receives supply voltages V401 and V402 from the outside. The supply voltage V401 is an I/O voltage of 3.3 V, and the supply voltage V402 is a core voltage of 1.5 V, for example. The laser driving unit 403 amplifies the differential voltage Vs401 from the arithmetic processing unit 401, superimposes a bias voltage Vb401 on the amplified voltage, and outputs the result as a drive voltage signal Vd401. The surface emitting laser device 402 receives the drive voltage signal Vd401 from the laser driving unit 403, and outputs laser signal light of a predetermined wavelength. The laser light output from the surface emitting laser device 402 has a wavelength corresponding to the energy bandgap of the semiconductor material of the active layer. The bias voltage Vb401 supplied to the surface emitting laser device 402 also corresponds to the energy bandgap of the semiconductor material of the active layer. For example, if the oscillation wavelength of the surface emitting laser device 402 is in the 850-nm band, the bias voltage Vb401 of approximately 3.3 V is usually supplied.

Lower power consumption is desired for surface emitting laser devices used in many ways, not only for surface emitting laser devices used for optical interconnection. One method being studied for decreasing the power consumption involves using a surface emitting laser device with a wavelength no less than 1000 nm that can significantly lower the bias voltage and the energy bandgap of the active layer, as shown in Nonpatent Document 1, for example.

Nonpatent Document 1: N. Suzuki, et al., "25-Gbps operation of 1.1-μm-range InGaAs VCSELs for high-speed optical interconnections", OFA4, OFC2006

The conventional surface emitting laser apparatus, however, cannot achieve sufficient reduction in power consumption by decreasing the power consumption of the surface emitting laser device. For example, in the surface emitting laser apparatus 400 shown FIG. 5, even if the bias voltage supplied to the surface emitting laser device 402 were lowered to 1.5 V, for example, the bias voltage Vb401, which is generally approximately 3.3 V, is supplied to the laser driving unit 403. Therefore, the bias voltage Vb401 must be stepped down by the laser driving unit 403 and then supplied to the surface emitting laser device 402. As a result, the laser driving unit 403 consumes an excessive amount of power for the voltage step-down. Furthermore, the laser driving unit 403 generally uses power to amplify a modulation signal of the differential voltage Vs401 output from the arithmetic processing unit 401 from ±100 mV to ±200 mV, for example. As a result, even when the power consumption of the surface emitting laser device 402 is lowered to 100 mW, for example, the power consumption of the laser driving unit 403 is as high as 500 mW to 1 W. Therefore, the surface emitting laser apparatus 400 cannot achieve sufficient reduction of power consumption in total.

SUMMARY

The present invention has been achieved in view of the above problems, and it is an object of the present invention to provide a surface emitting laser apparatus with low power consumption.

According to one aspect of the present invention, there is provided a surface emitting laser apparatus including an arithmetic processing unit that includes an I/O unit through which an instruction is externally input and a core unit that performs an operation based on the instruction input through the I/O unit and outputs a differential voltage signal modulated with a predetermined amplitude according to a result of the operation, capacitors respectively arranged on output paths of the differential voltage signal, and a surface emitting laser device that is directly connected to the arithmetic processing unit via the capacitors. An I/O voltage and a core voltage are externally supplied to the I/O unit and the core unit, respectively. The arithmetic processing unit generates a driving voltage signal by superimposing the differential voltage signal after passing the capacitors with the core voltage commonly supplied as a bias voltage without stepping down the core voltage and without amplifying the differential voltage signal and supplies a generated driving voltage signal to the surface emitting laser device.

The summary clause does not necessarily describe all necessary features of the embodiments of the present invention. The present invention may also be a sub-combination of the features described above.

DESCRIPTION OF EXEMPLARY EMBODIMENTS

Exemplary embodiments of the present invention will be described in detail below with reference to accompanying drawings. However, the embodiments should not be construed to limit the invention. All the combinations of the features described in the embodiments are not necessarily essential to means provided by aspects of the invention.

Figure 1:
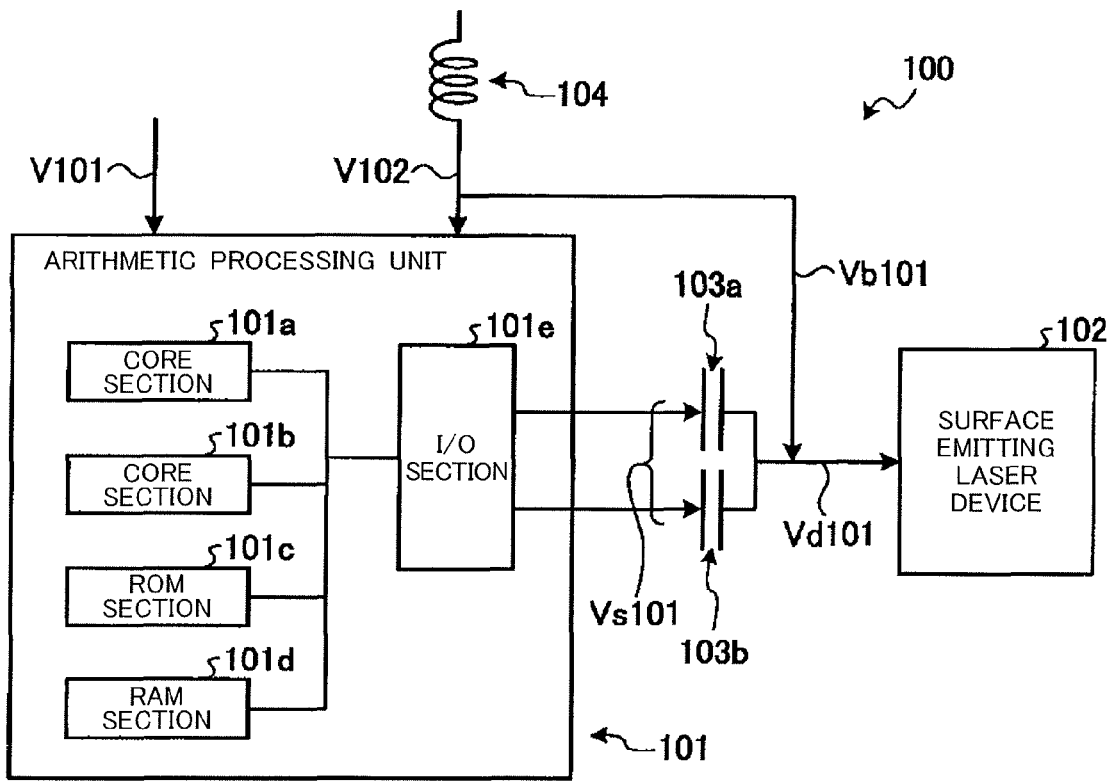
FIG. 1 is a block diagram of a surface emitting laser apparatus according to a first embodiment of the present invention.

FIG. 1 is a block diagram of a surface emitting laser apparatus 100 according to a first embodiment of the present invention. As shown in FIG. 1, the surface emitting laser apparatus 100 includes an arithmetic processing unit 101, a surface emitting laser device 102, capacitors 103a and 103b, and an inductor 104.

The arithmetic processing unit 101 includes core sections 101a and 101b, a ROM section 101c, a RAM section 101d, and an I/O section 101e. The core sections 101a and 101b read a program from the ROM section 101c and perform calculations according to instructions input to the I/O section 101e from the outside. Based on the calculation results, the core sections 101a and 101b output a differential voltage signal Vs101 modulated with amplitude of ±100 mV, for example, from the I/O section 101e. The core sections 101a and 101b also perform other calculations according to instructions input to the I/O section 101e from the outside, and write the calculation results to the RAM section 101d or output the calculation results from the I/O section 101e. The arithmetic processing unit 101 is supplied with supply voltages V101 and V102 from the outside. The supply voltage V102 is supplied via the inductor 104. The supply voltage V101 is 3.3 V and the supply voltage V102 is 1.5 V, for example. The supply voltage V101 is an I/O voltage supplied to the I/O section 101e. The supply voltage V102 is a core voltage supplied to the core sections 101a and 101b.

The surface emitting laser device 102 is directly connected to the arithmetic processing unit 101 via the capacitors 103a and 103b. The differential voltage signal Vs101 output from the arithmetic processing unit 101 is combined after passing through the capacitors 103a and 103b, and then the supply voltage V102 that is commonly supplied as a bias voltage Vb101 is superimposed. As a result, a drive voltage signal Vd101 is generated, and the generated drive voltage signal Vd101 is supplied to the surface emitting laser device 102. The capacitors 103a and 103b prevent the bias voltage Vb101 from being input to the arithmetic processing unit 101, and the inductor 104 prevents the differential voltage signal Vs101 from being input to the source supplying the supply voltage V102.

As described above, the surface emitting laser device 102 is directly connected to the arithmetic processing unit 101. The surface emitting laser device 102 is driven to output a laser signal light of a predetermined wavelength, by the drive voltage signal Vd101 obtained by superimposing the differential voltage signal Vs101 output from the arithmetic processing unit 101 on the bias voltage Vb101 that is the supply voltage V102 commonly supplied to the arithmetic processing unit 101. In this way, the surface emitting laser apparatus 100 generates the drive voltage signal Vd101 without using a laser driving unit, i.e. without amplifying the differential voltage signal Vs101 output from the arithmetic processing unit 101, and without stepping down the bias voltage Vb101 equal to the supply voltage V102. Therefore, the surface emitting laser apparatus 100 consumes significantly less power than the conventional surface emitting laser apparatus employing a laser driving unit.

The defining feature of the surface emitting laser apparatus is that "the surface emitting laser device 102 is directly connected to the arithmetic processing unit 101" which means that the connection is such that the differential voltage signal Vs101 output from the arithmetic processing unit 101 is supplied directly to the surface emitting laser device 102 without passing through a laser driving unit that amplifies, reproduces, or steps down the voltage, and a configuration in which elements such as the capacitors 103a and 103b that do not substantially change the characteristics of the differential voltage signal Vs101 are interposed is included within the scope of this type of connection.

Figure 2:
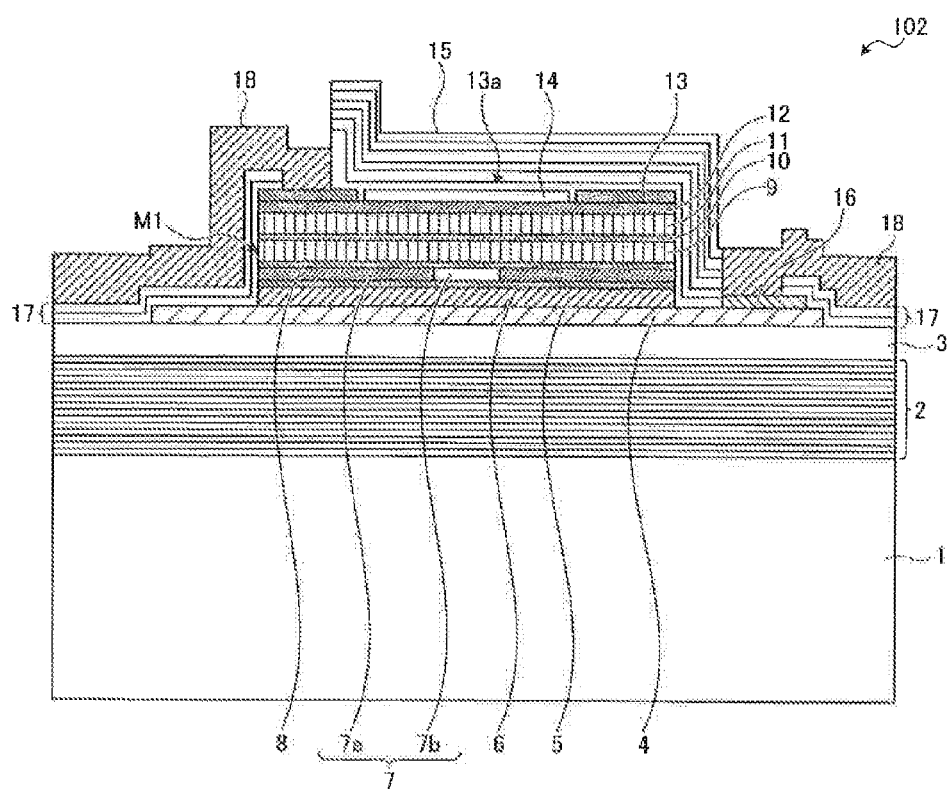
FIG. 2 is a schematic cross-sectional view of the surface emitting laser device shown in FIG. 1.

FIG. 2 is a schematic cross-sectional view of the surface emitting laser device 102 shown in FIG. 1.

As shown in FIG. 2, the surface emitting laser device 102 includes a substrate 1 on which a lower DBR mirror 2 that is a lower multilayer mirror, a buffer layer 3, an n-type contact layer 4, an active layer 5 with a multiple quantum well structure, a lower graded-composition layer 6, a current confinement layer 7 that includes a current confinement portion 7a positioned in the periphery thereof and a circular current injection portion 7b surrounded by the current confinement portion 7a, an upper graded-composition layer 8, a p-type spacer layer 9, a p$^+$-type current path layer 10, a p-type spacer layer 11, and a p$^+$-type contact layer 12, are formed in the stated order. A cylindrical mesa post M1 is formed from the active layer 5 to the p$^+$-type contact layer 12.

In the surface emitting laser device 102, the substrate 1 is made of undoped GaAs. The lower DBR mirror 2 is made of 34 pairs of GaAs/Al$_{0.9}$Ga$_{0.1}$As. The buffer layer 3 is made of undoped GaAs. The n-type contact layer 4 is made of n-type GaAs. The active layer 5 is formed with a layered structure in which three InGaAs quantum well layers and four GaAs barrier layers are formed in an alternating manner, so that a laser light of a wavelength in, for example, the 1100-nm band. In this structure, the lowest GaAs barrier layer also functions as an n-type cladding layer. In the current confinement layer 7, the current confinement portion 7a is made of Al$_2$O$_3$, and the current injection portion 7b is formed of AlAs with a diameter of 6 nm to 7 nm. The lower graded-composition layer 6 and the upper graded-composition layer 8 are made of AlGaAs, such that the Al composition thereof gradually increases toward the current confinement layer 7 in the thickness direction. The p-type spacer layers 9 and 11 and the p$^+$-type current path layer 10 and the p$^+$-type contact layer 12 are made of p-type and p$^+$-type GaAs doped with carbon, respectively. The acceptor or donor concentration for the p-type layer and n-type layer is approximately $1 \times 10^{18}$ cm$^{-3}$, and the acceptor concentration in each p$^+$-type layer is $1 \times 10^{19}$ cm$^{-3}$ or more. The refractive index of each semiconductor layer made of GaAs is 3.45.

A p-side annular electrode 13 made of Pt/Ti and including an opening 13a in the center thereof is formed on the p$^+$-type contact layer 12, with a circumference matching the circumference of the mesa post M1. The outer diameter of the p-side annular electrode 13 is 30 μm, for example, and the inner diameter of the opening 13a is 11 μm to 14 μm, for example.

A disc-shaped phase adjustment layer 14 made of dielectric material such as silicon nitride (SiN$_x$), is formed in the opening 13a of the p-side annular electrode 13. The phase adjustment layer 14 can suitably adjust the position of nodes and anti-nodes in a standing wave of light formed between an upper DBR mirror 15 and the lower DBR mirror 2, which form an optical resonator.

The upper DBR mirror 15, which is an upper multilayer mirror, is made of dielectric material and formed to span from the top of the phase adjustment layer 14 to the periphery of the mesa post M1. The upper DBR mirror 15 is made of 10 to 12 pairs of SiN$_x$/SiO$_2$, while changing the number of pairs depending on the refractive index of the material to achieve a favorable reflectivity of about 99%. Other materials such as α-Si/SiO$_2$ or α-Si/Al$_2$O$_3$ may also be used instead of SiN$_x$/SiO$_2$, The n-type contact layer 4 extends from the bottom of the mesa post M1 toward the periphery of the upper DBR mirror 15, A semi-annular n-side electrode 16 made of AuGaNi/Au is formed on the surface of the n-type contact layer 4. The n-side electrode 16 has, for example, an outer diameter of 80 μm and an inner diameter of 40 μm. A passivation film 17 made of dielectric material such as SiN$_x$ is formed in the region where the upper DBR mirror 15 is not formed, to protect the surface of the device.

A lead electrode 18 made of Au is formed to contact the n-side electrode 16 through the opening formed in the passivation film 17. Another lead electrode 18 made of Au is formed to contact the p-side annular electrode 13 through the opening formed in the passivation film 17. The surface emitting laser device 102 is directly connected to the arithmetic processing unit 101 via the lead electrodes 18.

When the drive voltage signal Vd101 is applied to the surface emitting laser device 102 from the lead electrodes 18 via the n-side electrode 16 and the p-side annular electrode 13 to inject current, the current flows mostly through the $p^+$-type contact layer 12 and the $p^+$-type current path layer 10, which have low resistance, and the current path is further narrowed in the current injection portion 7b by the current confinement layer 7, such that the active layer 5 is supplied with high current density. As a result, the active layer 5 is injected with carriers to emit a spontaneous light. This spontaneously emitted light includes a light of the wavelength in the 1100-nm band, which is the laser oscillation wavelength, and this light forms a standing wave between the lower DBR mirror 2 and the upper DBR mirror 15 and is amplified by the active layer 5. When the injected current exceeds a threshold value, the light forming the standing wave is laser-oscillated and the resulting laser light of the wavelength in the 1100-nm band is output from the opening 13a of the p-side annular electrode 13.

As described above, the bias voltage to be supplied to the surface emitting laser device corresponds to the energy bandgap of the active layer, i.e. to the oscillation wavelength. In the case of the surface emitting laser device 102, when the laser-oscillated light has the wavelength of 1100 nm (1.1 nm), the necessary bias voltage is approximately 1.13 V (1.24/1.1). Therefore, the bias voltage Vb101 of 1.5 V can be used directly without being stepped down. The actual bias voltage to be applied is equal to the sum of the value corresponding to the laser oscillation wavelength and the value of a voltage drop caused by the structure of the surface emitting laser device.

In the surface emitting laser device 102, the upper DBR mirror 15 is formed of dielectric material and the current is injected into the active layer 5 from the p-side annular electrode 13 without passing through the upper DBR mirror. As a result, the electrical resistance and thermal resistance is lower in the surface emitting laser device 102 than in a conventional surface emitting laser device in which the current is injected through an upper DBR mirror made of p-type semiconductor. Therefore, even when the bias voltage and peak-to-peak voltage of the drive voltage signal Vd101 are low, the laser light signal can be output with a sufficient extinction ratio.

Figure 3:
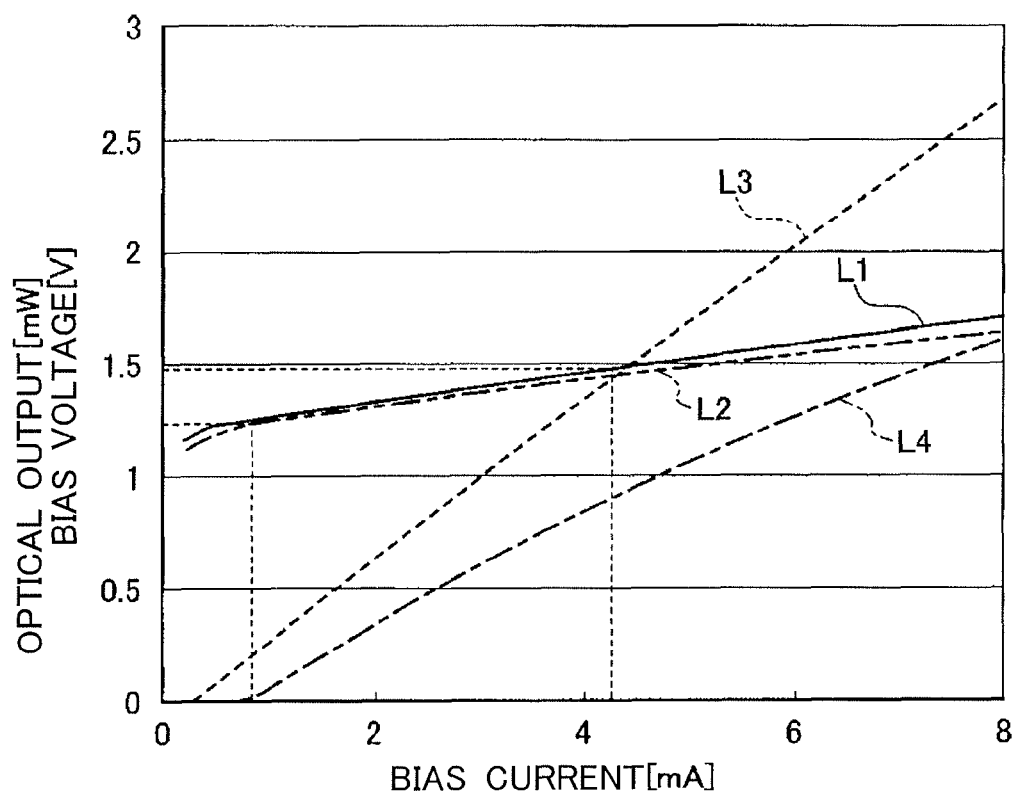
FIG. 3 shows an I-V characteristic and an I-L characteristic of a surface emitting laser device having the structure shown in FIG. 2.

FIG. 3 shows a relationship between bias current and bias voltage (I-V) and a relationship between bias voltage and laser light output (I-L) of a surface emitting laser device having the structure shown in FIG. 2. The operation temperature of the surface emitting laser device is set to 25° C. and 90° C. In FIG. 3, the lines L1 and L2 indicate the I-V characteristic at 25° C. and 90° C., respectively, and the lines L3 and L4 indicate the I-L characteristic at 25° C. and 90° C., respectively. As shown in FIG. 3, at a bias current near a threshold value, which is where the laser output increases at 90° C., the corresponding bias voltage is approximately 1.2 V. When the bias current is increased to 4 mA, for example, the bias voltage remains low at approximately 1.5 V.

As shown in FIG. 3, the characteristics of the surface emitting laser device 102 such as the threshold bias current and the optical output depend on the temperature, and therefore the threshold bias current changes depending on the temperature during use, which may be in a range from 0° C. to 90° C., for example. Accordingly, including a function for adjusting current amplitude according to temperature change of the surface emitting laser device 102, for example, is effective in terms of the power consumption.

For example, the surface emitting laser device 102 may be designed such that the threshold bias current is lowest at the upper limit of the usage temperature range. In this way, the optical output of the surface emitting laser device 102 increases as the temperature drops. Therefore, even though the voltage increases at the lower limit of the usage temperature range, the bias current is increased such that the optical output is the same as when operating at the upper limit of the temperature. As a result, optical output that is stable over the entire usage temperature range can be achieved with low power consumption and without using a temperature control device. The surface emitting laser device 102 described above can be designed using known detuning techniques such as setting the thickness of the phase adjustment layer 14 or setting a difference between the peak of the oscillation wavelength of the active layer 5 and the center wavelength of the optical resonator.

As described above, the surface emitting laser apparatus 100 according to the first embodiment consumes significantly less power than a conventional surface emitting laser apparatus.

Figure 4:
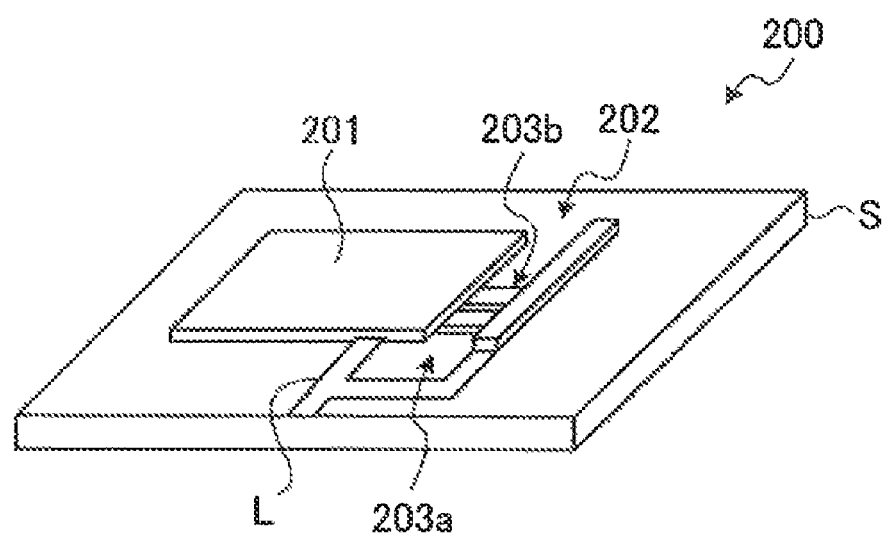
FIG. 4 is a schematic perspective view of a surface emitting laser apparatus according to a second embodiment of the present invention.
Figure 5:
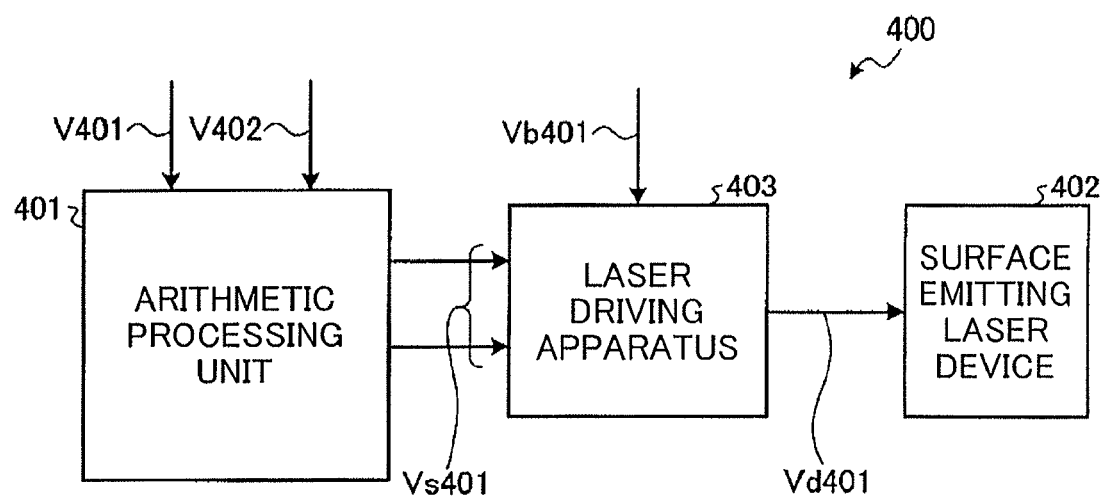
FIG. 5 is a block diagram of a conventional surface emitting laser apparatus.

FIG. 4 is a schematic perspective view of a surface emitting laser apparatus according to a second embodiment of the present invention. The surface emitting laser apparatus 200 includes an arithmetic processing unit 201, a surface emitting laser device 202, and capacitors 203a and 203b mounted on a substrate S.

The arithmetic processing unit 201 has the same structure as the arithmetic processing unit 101 shown in FIG. 1. The capacitors 203a and 203b may be chip capacitors, for example. The surface emitting laser device 202 is an array in which a plurality of surface emitting laser devices 102 are arranged one-dimensionally or two-dimensionally. Microstrip lines are formed on the substrate S to directly connect the arithmetic processing unit 201 and the surface emitting laser device 202 via the capacitors 203a and 203b. The differential voltage signal output from the arithmetic processing unit 201 is combined by the microstrip lines after passing through the capacitors 203a and 203b, and is then supplied to the surface emitting laser device 202.

A common DC voltage is supplied to the arithmetic processing unit 201 and the surface emitting laser device 202 via a power supply line L formed on the substrate S. This common DC voltage is supplied to the arithmetic processing unit 201 as a core voltage and is supplied to the surface emitting laser device 202 as a bias voltage. The bias voltage is superimposed on the differential voltage signal output from the arithmetic processing unit 201, and then supplied to the surface emitting laser device 202 as a drive voltage signal.

The surface emitting laser apparatus 200 generates the drive voltage signal without amplifying the differential voltage signal output from the arithmetic processing unit 201 and without stepping down the bias voltage that is equal to the supply voltage, and therefore has very low power consumption.

In the above embodiments, the core voltage is used as the bias voltage of the surface emitting laser device, which is set to 1.5 V; however, there is no particular limitation on the bias voltage as long as it is a supply voltage supplied to the arithmetic processing unit. The bias voltage can be selected according to the characteristics of the surface emitting laser device, and can be 1.0 V, 1.2 V, 1.5 V, 1.8 V, 2.5 V, or 3.3 V, for example. Furthermore, the material of the active layer of the surface emitting laser device, in other words, the laser oscillation wavelength, is preferably selected such that the bias voltage drops from the core voltage as little as possible based on the core voltage that can be used as the bias voltage. For example, the laser oscillation wavelength is preferably selected from the 1100-nm band when the bias voltage is 1.2 V, and is preferably selected from the 1300-nm band when the bias voltage is 1.0 V.

The voltage signal output from the arithmetic processing unit is not limited to a differential signal, and may instead be a single-end signal. The peak-to-peak voltage of the voltage signal is preferably no greater than 200 mV, since these values prevent a large increase in the power consumed by the arithmetic processing unit.

While the embodiments of the present invention have been described, the technical scope of the invention is not limited to the above described embodiments. The scope of the present invention includes combinations of the embodiments and components described above. It is apparent to persons skilled in the art that various alterations and improvements can be added to the above-described embodiments. It is also apparent from the scope of the claims that the embodiments added with such alterations or improvements can be included in the technical scope of the invention. For example, the surface emitting laser device array described in the second embodiment may be applied to the surface emitting laser apparatus of the third embodiment.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can realize a surface emitting laser apparatus with low power consumption.

What is claimed is:

1. A surface emitting laser apparatus, comprising:
an arithmetic processing unit that includes an I/O unit through which an instruction is externally input and a core unit that performs an operation based on the instruction input through the I/O unit and outputs a differential voltage signal modulated with a predetermined amplitude according to a result of the operation;
capacitors respectively arranged on output paths of the differential voltage signal; and
a surface emitting laser device that is directly connected to the arithmetic processing unit via the capacitors, wherein
an I/O voltage and a core voltage are externally supplied to the I/O unit and the core unit, respectively,
the arithmetic processing unit generates a driving voltage signal by superimposing the differential voltage signal after passing the capacitors with the core voltage commonly supplied as a bias voltage without stepping up or down the core voltage and without amplifying the differential voltage signal and supplies the generated driving voltage signal to the surface emitting laser device.

2. The surface emitting laser apparatus according to claim 1, wherein
the core voltage is supplied to the surface emitting laser device via an inductor,
the capacitors prevent an inflow of the bias voltage to the arithmetic processing unit, and
the inductor prevents an inflow of the differential voltage signal to a source of the core voltage.

3. The surface emitting laser apparatus according to claim 1, wherein the bias voltage corresponds to the oscillation wavelength of the surface emitting laser device.

4. The surface emitting laser apparatus according to claim 3, wherein
the bias voltage is configured to be selected from a plurality of voltages, and
the bias voltage is selected from the voltages based on the oscillation wavelength of the surface emitting laser device.

5. The surface emitting laser apparatus according to claim 2, wherein the bias voltage corresponds to the oscillation wavelength of the surface emitting laser device.

6. The surface emitting laser apparatus according to claim 5, wherein
the bias voltage is configured to be selected from a plurality of voltages, and
the bias voltage is selected from the voltages based on the oscillation wavelength of the surface emitting laser device.

7. The surface emitting laser apparatus according to claim 1, wherein a peak-to-peak voltage of the differential voltage signal is equal to or lower than 200 millivolts.

8. The surface emitting laser apparatus according to claim 1, wherein the bias voltage to be applied is equal to a sum of a value corresponding to an oscillation wavelength (=1240 [Vnm]/oscillation wavelength [nm]) and a value of a voltage drop caused by a structure of the surface emitting laser device.

9. The surface emitting laser apparatus according to claim 8, wherein
the core voltage is equal to or lower than 1.5 volts,
the oscillation wavelength is equal to or longer than 1000 nanometers, and
the bias voltage equal to or lower than 1.5 volts.

10. The surface emitting laser apparatus according to claim 1, wherein the surface emitting laser apparatus has a function of adjusting a current amplitude of a bias current according to a temperature change of the surface emitting laser apparatus.

11. The surface emitting laser apparatus according to claim 1, wherein the surface emitting laser apparatus is configured to have a threshold bias current that is lowest at an upper limit of an operating temperature range.

12. The surface emitting laser apparatus according to claim 11, wherein the operating temperature range is from 0° C. to 90° C.

* * * * *